United States Patent [19]

Huang et al.

[11] Patent Number: 6,119,736
[45] Date of Patent: Sep. 19, 2000

[54] VEHICLE FOR TRANSPORTING WET OBJECTS

[75] Inventors: Chien-Chung Huang, Taichung; Shen Hsiang Yin, Hsin-Chu, both of Taiwan

[73] Assignee: Taiwan Semiconductor Manufacturing Company, Ltd., Hsin Chu, Taiwan

[21] Appl. No.: 09/324,388

[22] Filed: Jun. 3, 1999

[51] Int. Cl.[7] .............................. B65B 1/04; B65B 3/04; B67C 3/02
[52] U.S. Cl. .............................. 141/88; 141/86; 141/87; 184/106
[58] Field of Search .................................. 141/86, 87, 88, 141/231, 363, 364, 369; 137/312, 313, 314; 222/108; 184/106; 4/516

[56] References Cited

U.S. PATENT DOCUMENTS

| | | | |
|---|---|---|---|
| 2,133,770 | 10/1938 | McGlohon | 141/88 |
| 2,472,921 | 6/1949 | Quimper | 141/88 |
| 4,606,363 | 8/1986 | Scales | 134/111 |

FOREIGN PATENT DOCUMENTS 704 of 1904 United Kingdom ..................... 141/88

*Primary Examiner*—Henry J. Recla
*Assistant Examiner*—Timothy L. Maust
*Attorney, Agent, or Firm*—Tung & Associates

[57] ABSTRACT

A vehicle for transporting wet objects in a manufacturing facility such as a push cart for transporting wet objects in a semiconductor fabrication plant is disclosed. The vehicle is equipped with a plurality of liquid-collecting trays wherein each of the trays is equipped with an inclined bottom panel with a drain hole at the lowest point and a horizontally positioned top panel equipped with a multiplicity of apertures. Liquid drained from the liquid-collecting trays is collected by a drain pipe into a drain tank mounted at the bottom of the push cart. The present invention novel push cart enables a wet object to be transported in the liquid-collecting trays in a relatively dry condition without contaminating other objects which are also carried in the tray. Furthermore, the present invention novel push cart prevents liquid from accidentally spilling out from the trays and causing personal injury or property damage. The liquid drain tank mounted at the bottom of the push cart can be emptied when it is full by a drain plug. The liquid level in the drain tank can be observed through a semi-transparent material that is used for molding the drain tank.

19 Claims, 1 Drawing Sheet

VEHICLE FOR TRANSPORTING WET OBJECTS

FIELD OF THE INVENTION

The present invention generally relates to a vehicle for transporting wet objects and more particularly, relates to a push cart for transporting wet objects in a semiconductor fabrication facility where liquid can be drained into a liquid drain tank.

BACKGROUND OF THE INVENTION

In a manufacturing facility, items such as work-in-process parts or processing tools and apparatus are frequently transported between parts storage facility, processing stations and various other places in a fabrication plant. Some of the items transported are wet or contain a liquid because they have been processed in a wet bench process or otherwise in a process where liquid chemicals are used, i.e., frequently the case in a semiconductor fabrication facility. For instance, wafers that are stored in a pod after being processed in a chemical mechanical polishing apparatus are still wet because of the liquid polishing compound left on the surface of the wafers. As a result, wet cassettes or other wet processing accessories and tools are transported between processing stations on a push cart or trolley.

In order to avoid liquid from spilling to lower trays in the push cart, a container is often designed in the trays. After usage, the container in the push cart is frequently in a wet condition. This causes numerous processing difficulties and problems. For instance, the liquid may damage other parts that are also stored in the same container. The liquid may splash out of the container and thus wet the factory floor either causing a safety hazard, or when the liquid is an acid or an alkaline, the floor may be damaged in addition to the possibility of personal injuries. Moreover, the container must be emptied periodically by operator to dispose the liquid contained therein. The manual dumping of liquid from the container is laborious and may cause personal injury upon contact with the liquid.

In a semiconductor fabrication facility where chemical mechanical polishing apparatus is widely utilized, it has been noticed that push carts used to transport wet cassettes (which contains wet wafers) must have their containers in the trays emptied every 4~6 hours. This becomes a tedious and time consuming process, in addition to the processing problems discussed above.

It is therefore an object of the present invention to provide a vehicle for transporting wet objects in a factory that does not have the drawbacks or shortcomings of the conventional push carts.

It is another object of the present invention to provide a vehicle for transporting wet objects in a semiconductor fabrication facility that does not present the danger of personal injuries when liquid chemicals are involved.

It is a further object of the present invention to provide a vehicle for transporting wet objects in a semiconductor fabrication facility where wet cassettes after a chemical mechanical polishing process are being transported.

It is another further object of the present invention to provide a push cart for transporting wet objects in a semiconductor fabrication facility wherein horizontal liquid-collecting trays equipped with an inclined bottom panel and a perforated top panel are utilized.

It is still another object of the present invention to provide a push cart for transporting wet objects in a semiconductor processing facility wherein horizontal liquid-collecting trays are installed in the push cart and each of the trays is provided with a drain hole for draining liquid into a liquid drain tank mounted at the bottom of the push cart.

It is yet another object of the present invention to provide a push cart for transporting wet objects in a semiconductor processing facility wherein liquid is collected in a drain tank positioned at the bottom of the push cart and fabricated in a substantially transparent material such that liquid level in the drain tank can be readily observed.

It is still another further object of the present invention to provide a push cart for transporting wet objects in a semiconductor fabrication facility wherein horizontal liquid-collecting trays are utilized and each tray is equipped with a drain hole for draining liquid into a drain tank through a liquid drain pipe in fluid communication with the drain holes.

It is yet another further object of the present invention to provide a push cart for transporting wet objects in a semiconductor fabrication facility wherein three horizontal liquid-collecting trays are provided in the push cart each equipped with a drain hole for draining liquid into a drain tank positioned at the bottom of the push cart.

SUMMARY OF THE INVENTION

In accordance with the present invention, a vehicle for transporting wet objects in a manufacturing facility is provided.

In a preferred embodiment, a vehicle for transporting wet objects is provided which includes a frame structure formed of a horizontal top frame and a horizontal bottom frame spaced apart and connected together by four vertical side frames, at least one liquid-collecting tray horizontally supported by one of the top and bottom frames, the liquid-collecting tray is equipped with an inclined bottom panel and a drain hole at a lowest point of the panel, the tray is further provided with a horizontal top panel equipped with apertures therethrough for supporting a wet object positioned on top and for draining liquid through the apertures into the liquid-collecting tray, a liquid drain pipe that has an upper opening in fluid communication with the liquid drain hole in the liquid-collecting tray and a lower opening in fluid communication with a liquid drain tank. A liquid drain tank situated below the liquid-collecting tray for collecting a liquid drain from the tray, and wheel means mounted on the horizontal bottom frame for providing mobility to the frame structure.

The vehicle for transporting wet objects may further include three liquid-collecting trays with one on each of the horizontal top frame, the horizontal bottom frame and the horizontal middle frame. The vehicle may be a push cart equipped with four swivel wheels mounted on the bottom frame. The liquid drain pipe may further include a middle opening in fluid communication with a liquid drain hole in the liquid-collecting tray mounted in the horizontal middle frame. The apertures provided in the horizontal top panel of the liquid-collecting trays may have a diameter between about 5 mm and about 10 mm. The apertures provided in the horizontal top panel of the liquid-collecting tray are spaced apart by a distance of not more than 15 mm.

In the vehicle for transporting wet objects, the inclined bottom panel in the liquid-collecting tray forms an angle with a horizontal plane of between about 10° and about 30°. The horizontal top panel of the liquid-collecting tray is fabricated of an inert, corrosion-resistant material, such as stainless steel or a Teflon coated metal material. The horizontal top panel of the liquid-collecting tray is further equipped with attachment apparatus for horizontally supporting the top panel on the liquid-collecting tray. The liquid drain tank is fabricated of a substantially transparent material such that a liquid level in the tank may be visible. The liquid drain tank and the liquid drain pipe may be fabricated of an inert, corrosion-resistant material.

In an alternate embodiment, the present invention push cart for transporting wet objects in a semiconductor fabrication facility may be provided which includes a frame member formed of at least two horizontal frames supported by vertical side frames at four corners, at least two liquid-collecting trays each supported by one of the at least two horizontal frames, the liquid-collecting trays may be provided with an inclined bottom panel and a drain hole at a lowest point of the panel, the liquid-collecting trays may further be provided with a horizontal top panel that has apertures therethrough for supporting a wet object positioned on top and for draining liquid through the apertures into the liquid-collecting tray, a liquid drain pipe that has at least two openings in fluid communication with the liquid drain hole in the at least two liquid-collecting trays and a bottom opening fed into a liquid drain tank, a liquid drain tank formed of a substantially transparent material positioned below the at least two liquid-collecting trays for collecting liquid drained from the trays, and a plurality of wheels mounted on a bottom surface of the frame member.

The push cart for transporting wet objects in a semiconductor fabrication facility may further include a middle horizontal frame adapted for holding a liquid-collecting tray therein between a top horizontal and a bottom horizontal frame. The apertures provided in the horizontal top panel of the liquid-collecting trays may have a diameter between about 5 mm and about 10 mm. The apertures provided in the horizontal top panel of the liquid-collecting trays are spaced-apart by a distance of not more than 15 mm, and preferably not more than 10 mm. The inclined bottom panel in the liquid-collecting trays forms an angle with a horizontal plane between about 10° and about 30°, and preferably between about 15° and about 25°. The horizontal top panels of the liquid-collecting trays are fabricated of an inert, corrosion-resistant material such as stainless steel or a Teflon coated metal. The horizontal top panels of the liquid-collecting trays are further provided with hook means for horizontally attaching the top panel to the liquid-collecting trays.

BRIEF DESCRIPTION OF THE DRAWINGS

These and other objects, features and advantages of the present invention will become apparent from the following detailed descriptions and the appended drawings in which.

DETAILED DESCRIPTION OF THE PREFERRED EMBODIMENT

The present invention discloses a vehicle, or a push cart, for transporting wet objects in a manufacturing facility. The vehicle can be used in any fabrication facility, and is particularly suited for use in a semiconductor fabrication facility wherein wet objects are frequently transported between processing stations. For instance, wet cassettes contain wet wafers after chemical mechanical processing are frequently carried on a push cart for transporting to the next processing station.

The present invention push cart is equipped with a liquid drain tank at the bottom of the cart for collecting liquid from each of the liquid-collecting trays in which the wet objects are placed. A most versatile embodiment of the present invention push cart has three liquid-collecting trays for storing and carrying wet objects. Each of the liquid-collecting tray is provided with an inclined bottom surface such that liquid drains to the lowest corner wherein a drain hole is provided. A horizontal top panel that is provided with a multiplicity of apertures is positioned horizontally on top of the liquid-collecting tray for loading of the wet objects. Liquid drains from the wet objects through the apertures into the inclined bottom panel and into the drain hole. The drain holes of the three liquid-collecting trays are connected to a liquid drain pipe which then feed the liquid collected into a drain tank that is mounted at the bottom of the push cart. When the liquid drain tank is fabricated of a semi-transparent or a substantially transparent material, such as a plastic material, the liquid level in the drain tank can be readily observed by a machine operator and thus emptied before it is full. A drain opening can be provided at the bottom of the liquid drain tank for easy removal or draining away of the liquid contained therein.

Figure 1:
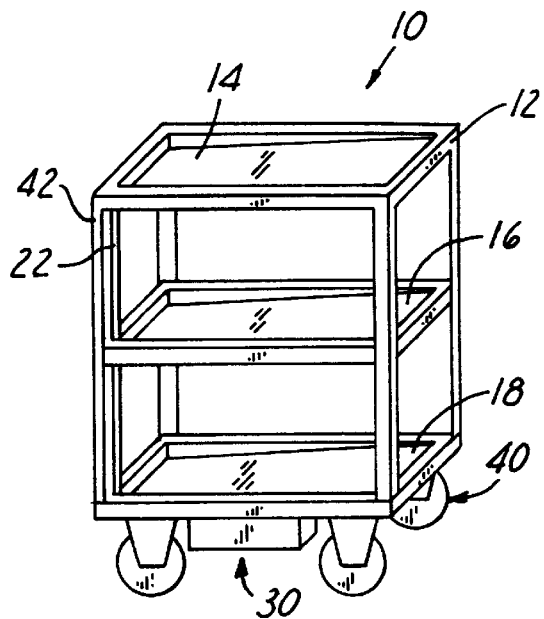
FIG. 1 is a perspective view of the present invention push cart with a drain tank mounted at the bottom of the cart.

Referring initially to FIG. 1, wherein a present invention push cart 10 is shown. The push cart 10 is constructed by a frame structure 12 and three liquid-collecting trays 14, 16 and 18. Each of the liquid-collecting trays is equipped with an inclined bottom panel and connected to a liquid drain pipe 22 through drain holes (not shown). Each of the liquid-collecting trays is further provided with a horizontal top panel (not shown) that is equipped with a multiplicity of apertures. The present invention push cart is further provided with a drain tank 30 mounted at the bottom of the push cart for collecting liquid from the drain pipe 22. The push cart 10 is further equipped with a plurality of wheels 40 for providing mobility to the push cart.

Figure 2:
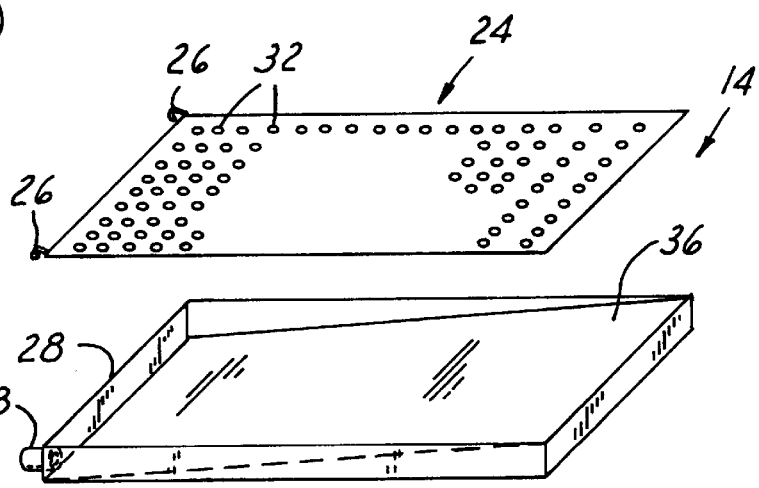
FIG. 2 is an enlarged, perspective view of the top panel and the bottom panel in a liquid-collecting tray equipped with a drain hole.

An enlarged, perspective view of the present invention liquid-collecting tray, one of 14, 16 and 18 is shown in FIG. 2. In the liquid-collecting tray 14, top panel 24 is provided with hook means 26 for attaching to an edge 28 of the liquid-collecting tray 14 in a horizontal position. The top panel 24 is further provided with a plurality of apertures 32 which has a diameter between about 5 mm and about 10 mm. An average size of the apertures is about 8 mm in diameter. The apertures 32 can be provided at any suitable spacing between two adjacent apertures, for instance, at less than 15 mm, or about 5 mm.

The liquid-collecting tray 14 is provided with an inclined bottom panel 36 which is inclined at an angle formed with a horizontal plane at between about 10° and about 30°, and preferably between about 15° and about 25°. A drain plug 38 is further provided at the lowest point of the inclined bottom panel 36 to facilitate the draining of liquid collected in the liquid-collecting tray 14.

The components of the liquid-collecting tray 14, i.e., the top panel 24, the bottom inclined panel 36 and the drain plug 38 can be fabricated of an inert, corrosion-resistant material. A suitable material is stainless steel, or a Teflon-coated metal material. The top panel 24 should be fabricated in a suitable thickness such that it has sufficient rigidity to support a minimum weight without sagging or bending. For instance, in the push cart shown in FIG. 1, two wafer pods for 8 inch wafers are manually carried in each of the liquid-collecting trays 14, 16 and 18. The top panel 24 must therefore withstand a weight of two fully loaded wafer pods without bending or otherwise deforming.

Figure 3:
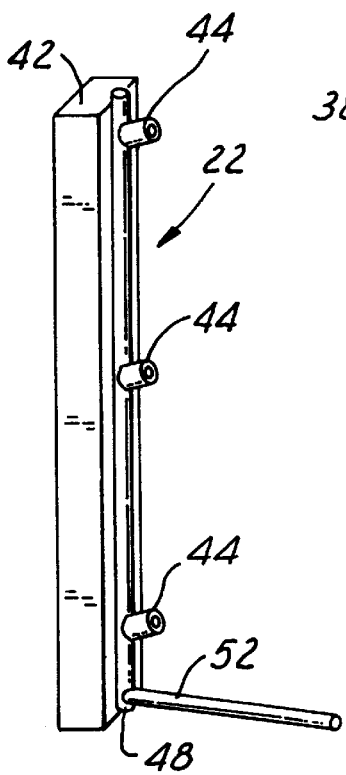
FIG. 3 is a perspective view of a liquid drain pipe mounted on a side frame for the push cart.
Figure 4:
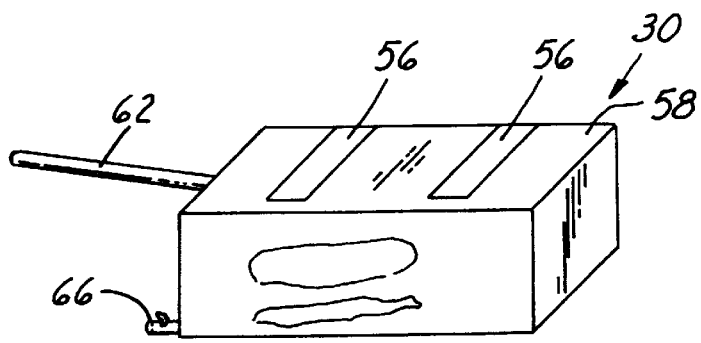
FIG. 4 is a perspective view of a liquid drain tank for collecting liquid.

FIG. 3 shows a perspective view of the liquid drain pipe 22 mounted on a side frame 42 for the present invention push cart 10. A plurality of liquid inlets 44 are provided for connecting to the drain plugs 38 in the liquid-collecting trays 14, 16 and 18. At the bottom end 48 of the liquid drain pipe 22, a lower drain pipe 52 is further provided for feeding the liquid collected in the drain pipe 22 into a liquid drain tank 30, shown in FIG. 4.

The liquid drain tank 30 can be mounted by tracks 56 provided on the top surface 58 of the drain tank for mating to female tracks (not shown) provided on the bottom surface of the push cart 10. The tracks 56 should be designed such that drain tank 30 can be easily slid in or out from under the push cart 10 for maintenance or cleaning, when necessary. The liquid drain tank 30 is further equipped with a drain inlet 62 for connecting to the lower drain pipe 52 attached to the liquid drain pipe 22. Instead of removing drain tank 30 for disposing liquid, a drain plug 66 equipped with a shut off valve may be provided at the bottom of the drain tank 30 for discharging liquid collected. The liquid drain tank 30 should be fabricated in a material that is semi-transparent or translucent such that the liquid level in the tank can be readily observed to eliminate the possibility of an overfill condition. The tank can be molded of a polypropylene material which is inert to most chemicals and is translucent for easy observation.

The present invention push cart can be advantageously used in a semiconductor fabrication facility for transporting wet objects. Wet objects are loaded into liquid-collecting trays while liquid draining from the objects are collected in a drain tank positioned below the push cart. The wet objects are therefore kept in a substantially dry condition and does not contaminate other objects which may be carried in the liquid-collecting tray.

The present invention novel push cart has therefore been amply described in the above descriptions and in the appended drawings of FIGS. 1~4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A vehicle for transporting wet objects comprising:
   a frame structure formed of a horizontal top frame, a horizontal middle frame and a horizontal bottom frame spaced-apart and connected together by a plurality of vertical side frames, three liquid-collecting trays with one on each of said horizontal top frame, said horizontal bottom frame and a horizontal middle frame, said liquid-collecting trays being equipped with an inclined bottom panel and a drain hole at a lowest point of the panel, said trays being further provided with a horizontal top panel having apertures therethrough for supporting a wet object positioned thereon and for draining liquid through said apertures into said liquid-collecting trays,
   a liquid drain pipe having an upper opening in fluid communication with said liquid drain hole in said liquid-collecting trays and a lower opening in fluid communication with a liquid drain tank,
   a liquid drain tank situated below said three liquid-collecting trays for collecting a liquid drained from said trays, and
   means for moving said vehicle mounted on said horizontal bottom frame for providing mobility to said frame structure.

2. A vehicle for transporting wet objects according to claim 1, wherein said vehicle is a push cart equipped with four swivel wheels mounted on said bottom frame.

3. A vehicle for transporting wet objects according to claim 1, wherein said liquid drain pipe further comprising a middle opening in fluid communication with a liquid drain hole in said liquid-collecting tray mounted in said horizontal middle frame.

4. A vehicle for transporting wet objects according to claim 1, wherein said apertures provided in said horizontal top panel of said liquid collecting tray have a diameter between about 5 mm and about 10 mm.

5. A vehicle for transporting wet objects according to claim 1, wherein said apertures provided in said horizontal top panel of said liquid-collecting tray are spaced apart by a distance of not more than 15 mm.

6. A vehicle for transporting wet objects according to claim 1, wherein said inclined bottom panel in said liquid-collecting tray forms an angle with a horizontal plane of between about 10° and about 30°.

7. A vehicle for transporting wet objects according to claim 1, wherein said horizontal top panel of said liquid-collecting tray is fabricated of an inert, corrosion-resistant material.

8. A vehicle for transporting wet objects according to claim 1, wherein said horizontal top panel of said liquid-collecting tray is fabricated of stainless steel.

9. A vehicle for transporting wet objects according to claim 1, wherein said horizontal top panel of said liquid-collecting tray is fabricated of a Teflon-coated metal.

10. A vehicle for transporting wet objects according to claim 1, wherein said horizontal top panel of said liquid-collecting tray is further equipped with attachment means for horizontally supporting said top panel on said liquid-collecting tray.

11. A vehicle for transporting wet objects according to claim 1, wherein said liquid drain tank is fabricated of a substantially transparent material such that a liquid level in the tank is visible.

12. A vehicle for transporting wet objects according to claim 1, wherein said liquid drain tank and said liquid drain pipe are fabricated of an inert, corrosion-resistant material.

13. A push cart for transporting wet objects in a semiconductor fabrication facility comprising:
   a frame member formed of at least two horizontal frames supported by vertical side frames at four corners,
   at least two liquid-collecting trays each supported by one of said at least two horizontal frames, said liquid-collecting trays being provided with an inclined bottom panel and a drain hole at a lowest point of the panel, said liquid-collecting trays being further provided with a horizontal top panel having apertures therethrough for supporting a wet object positioned thereon and for draining liquid through said apertures into said liquid-collecting tray, a liquid drain pipe having at least two openings in fluid communication with said liquid drain holes in said at last two liquid-collecting trays and a bottom opening fed into a liquid drain tank, a liquid drain tank formed of a substantially transparent material positioned below said at least two liquid-collecting trays for collecting liquid drained from said trays, and a plurality of wheels mounted on a bottom surface of said frame member.

14. A push cart for transporting wet objects in a semiconductor fabrication facility according to claim 13 further comprising a middle horizontal frame adapted for holding a liquid collecting tray thereinbetween a top horizontal and a bottom horizontal frame.

15. A push cart for transporting wet objects in a semiconductor fabrication facility according to claim 13, wherein said apertures provided in said horizontal top panel of said liquid collecting tray have a diameter between about 5 mm and about 10 mm.

16. A push cart for transporting wet objects in a semiconductor fabrication facility according to claim 13, wherein said apertures provided in said horizontal top panel of said liquid-collecting tray are spaced apart by a distance of not more than 15 mm.

17. A push cart for transporting wet objects in a semiconductor fabrication facility according to claim 13, wherein said inclined bottom panel in said liquid-collecting tray forms an angle with a horizontal plane of between about 10° and about 30°.

18. A push cart for transporting wet objects in a semiconductor fabrication facility according to claim 13, wherein said horizontal top panel of said liquid-collecting tray is fabricated of an inert, corrosion-resistant material.

19. A push cart for transporting wet objects in a semiconductor fabrication facility according to claim 13, wherein said horizontal top panel of said liquid-collecting tray is further equipped with attachment means for horizontally supporting said top panel on said liquid-collecting tray.

* * * * *